US012610326B2

(12) United States Patent
Contal

(10) Patent No.: US 12,610,326 B2
(45) Date of Patent: Apr. 21, 2026

(54) COMMUNICATION DEVICE COMPRISING A POWER AMPLIFIER AND METHOD OF IMPLEMENTATION

(71) Applicant: SAGEMCOM BROADBAND SAS, Rueil Malmaison (FR)

(72) Inventor: Serge Contal, Rueil-Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 165 days.

(21) Appl. No.: 18/343,734

(22) Filed: Jun. 28, 2023

(65) Prior Publication Data

US 2024/0007974 A1     Jan. 4, 2024

(30) Foreign Application Priority Data

Jun. 30, 2022     (FR) ...................................... 2206600

(51) Int. Cl.
*H04W 52/36*          (2009.01)
*H04W 52/24*          (2009.01)
*H03F 1/02*            (2006.01)

(52) U.S. Cl.
CPC ....... *H04W 52/367* (2013.01); *H04W 52/248* (2013.01); *H03F 1/0211* (2013.01)

(58) Field of Classification Search
CPC . H04W 52/367; H04W 52/248; H04W 52/24; H03F 1/0211
See application file for complete search history.

(56) References Cited

U.S. PATENT DOCUMENTS

2012/0188017 A1* 7/2012 Qian ..................... H03F 1/0216
330/96
2016/0315586 A1* 10/2016 Itagaki .................... H03F 3/211
2020/0119695 A1* 4/2020 Shimamoto .......... H03G 1/0017

FOREIGN PATENT DOCUMENTS

EP          3089359 A1    11/2016
EP          3866336 A1    8/2021

OTHER PUBLICATIONS

Foreign Communication from a Related Counterpart Application, French Search Report and Written Opinion dated Jan. 31, 2023, French Application No. 2206600 filed on Jun. 7, 1974.

* cited by examiner

*Primary Examiner* — John J Lee
(74) *Attorney, Agent, or Firm* — Conley Rose, P.C.

(57)          ABSTRACT
A communication device includes a power amplifier configured to amplify a signal being emitted on a frequency channel; a variable voltage source to supply a bias voltage of the amplifier; a memory comprising software code and a processor which, when executing the software code, causes the device to adjust the bias voltage according to the frequency channel or a modulation of the signal; the processor adapted to produce, from pre-programmed data and as a function of the at least one parameter, a control signal that is representative of the adjusted value of the bias voltage; the pre-programmed data being such that for a given frequency channel, a bias voltage produced for a first modulation defined by a constellation comprising a first number of points is greater than a bias voltage produced for a second modulation comprising a second number of points that is greater than the first number of points.

9 Claims, 4 Drawing Sheets

E201
Obtaining the transmission channel and modulating a signal to be transmitted E202
Adjusting the supply voltage of the amplifier as a function of the transmission channel and modulation of the signal E203
Generating an amplified signal based on the signal to be transmitted

COMMUNICATION DEVICE COMPRISING A POWER AMPLIFIER AND METHOD OF IMPLEMENTATION

CROSS-REFERENCE TO RELATED APPLICATIONS

The present application claims priority to French Application No. 2206600 filed with the Intellectual Property Office of France on Jun. 30, 2022, which is incorporated herein by reference in its entirety for all purposes.

TECHNICAL FIELD

A communication device comprising a power amplifier and implementation method is described, which can be used in particular in a wireless network.

BACKGROUND OF THE INVENTION

A communication device such as a receiver/transmitter in a wireless communication network can consume a non-negligible amount of energy. In such a device, the circuits linked to the amplification of a signal intended to be emitted by an antenna represent a major share of this consumption. It is desirable to reduce the consumption thereof when possible.

SUMMARY OF THE INVENTION

One or more embodiments relate to a communication device comprising:
- a power amplifier configured to amplify a signal intended to be emitted on a frequency channel;
- a variable voltage source for providing a bias voltage of the amplifier;
- a memory comprising software code and a processor which, when executing the software code, causes the device to adjust the bias voltage provided by the variable voltage source according to at least one parameter comprising the frequency channel and a modulation of the signal;
- the processor and the software code being adapted to lead the device to produce, from pre-programmed data and as a function of the at least one parameter, a control signal of the variable voltage source, said control signal being representative of the adjusted value of the bias voltage;
- the pre-programmed data being such that for a given frequency channel, a bias voltage produced for a first modulation defined by a constellation comprising a first number of points is greater than a bias voltage produced for a second modulation comprising a second number of points, the second number of points being greater than the first number of points.

By adjusting the bias voltage, the consumption of the amplifier is adapted as a function of said at least one parameter. In particular, the adjustment makes it possible to adapt the power that the amplifier can provide to fit the needs or constraints of transmitting a signal based in particular on the transmission channel.

According to a particular embodiment of the device, the adjustment voltage being adapted to, when a power that the amplifier can supply to a nominal supply voltage is not necessary for the transmission of the signal, decrease the power that the amplifier can supply following the adjustment of the supply voltage, the power that the amplifier can supply following the adjustment being greater than or equal to a maximum transmission power threshold of the signal as a function of the at least one parameter.

According to one particular embodiment of the device, the data are configured to allow the device to obtain, as a function of the at least one parameter, at least one of:
- a value of the control signal;
- a bias voltage value to be used for the signal;
- a maximum transmission power value to be used for the signal.

According to a particular embodiment of the device, the at least one value is adapted to limit the power supplied by the amplifier to respect at least one of:
- a maximum power constraint based on a frequency band to which frequency channel belongs; or
- if the frequency channel overlaps with several frequency bands, a strict constraint among constraints respectively depending on each of the frequency bands.

According to one particular embodiment of the device, the processor and the software code being adapted to, in the case where the voltage source generates discrete values of bias voltage, cause the device to produce a control signal value of the variable voltage source corresponding to an equal discrete voltage value or a discrete voltage value immediately above a voltage value determined from the data.

One or more embodiments relate to a method implemented by a communication device comprising a power amplifier configured to amplify a signal intended to be emitted on a frequency channel; a variable voltage source for supplying a bias voltage of the amplifier; a memory comprising software code and a processor which, when it executes the software code, causes the device to perform the method, the method comprising:
- adjusting the bias voltage provided by the variable voltage source as a function of at least one parameter comprising the frequency channel and a modulation of the signal;
- generating, as a function of pre-programmed data and the at least one parameter, a control signal of the variable voltage source, said control signal being representative of the adjusted value of the bias voltage;
- the pre-programmed data being such that for a given frequency channel, a bias voltage produced for a first modulation defined by a constellation comprising a first number of points is greater than a bias voltage produced for a second modulation comprising a second number of points, the second number of points being greater than the first number of points.

According to a particular embodiment of the method, the adjustment voltage is adapted to, when a power that the amplifier can supply to a nominal supply voltage is not necessary for the transmission of the signal, decrease the power that the amplifier can supply following the adjustment of the supply voltage, the power that the amplifier can supply following the adjustment being greater than or equal to a maximum transmission power threshold of the signal as a function of the at least one parameter.

According to one particular embodiment of the method, the data are configured to allow the device to obtain, as a function of the at least one parameter, at least one of:
- a value of the control signal;
- a bias voltage value to be used for the signal;
- a maximum transmission power value to be used for the signal.

According to a particular embodiment of the method, the at least one value is adapted to limit the power supplied by the amplifier to respect at least one of:

a maximum power constraint based on a frequency band to which frequency channel belongs; or if the frequency channel overlaps with several frequency bands, a strict constraint among constraints respectively depending on each of the frequency bands.

According to one particular embodiment, the method comprises, in the case where the voltage source generates discrete values of bias voltage, producing a control signal value of the variable voltage source corresponding to an equal discrete voltage value or a discrete voltage value immediately above a voltage value determined from the data.

One or more embodiments relate to a non-transitory storage medium readable by a device provided with a processor, said medium comprising instructions which, when the program is executed by a processor of a device, prompt one of the above devices to implement one of the described associated methods.

BRIEF DESCRIPTION OF THE FIGURES

Further features and advantages will become apparent from the following detailed description, which may be understood with reference to the attached drawings in which.

DETAILED DESCRIPTION

Figure 1:
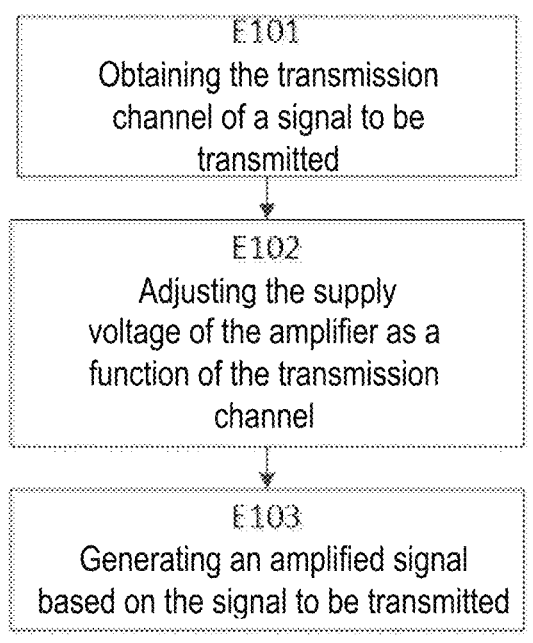
FIG. 1 is an algorithmic flowchart of the method according to a first non-limiting embodiment.

In the following description, identical, similar or analogous elements will be referred to by the same reference numbers. Unless otherwise indicated, the diagrams are not necessarily to scale.

The block diagrams, flowcharts and message sequence diagrams in the figures illustrate the architecture, functionalities and operation of systems, devices, methods and computer program products according to one or more exemplary embodiments. Each block of a block diagram or each step of a flowchart may represent a module or a portion of software code comprising instructions for implementing one or more functions. According to certain implementations, the order of the blocks or the steps may be changed, or else the corresponding functions may be implemented in parallel. The method blocks or steps may be implemented using circuits, software or a combination of circuits and software, in a centralized or distributed manner, for all or part of the blocks or steps. The described systems, devices, processes and methods may be modified or subjected to additions and/or deletions while remaining within the scope of the present disclosure. For example, the components of a device or system may be integrated or separated. Likewise, the features disclosed may be implemented using more or fewer components or steps, or even with other components or by means of other steps. Any suitable data-processing system can be used for the implementation. An appropriate data-processing system or device comprises for example a combination of software code and circuits, such as a processor, controller or other circuit suitable for executing the software code. When the software code is executed, the processor or controller prompts the system or device to implement all or part of the functionalities of the blocks and/or steps of the processes or methods according to the exemplary embodiments. The software code can be stored in a memory or a readable medium accessible directly or via another module by the processor or controller.

In a communication network, maximum power thresholds in transmission by a transceiver device can be imposed as a function of a frequency band or frequency sub-band. For example, a regulation defines for each country maximum power thresholds for each band or sub-band in the case of a wireless local area communication network operating according to one of the 802.11 family of standards published by the Institute of Electrical and Electronics Engineers ("IEEE") also known as the "WiFi" standard. In another example, certain local provisions are based on coordination of authorized maximum powers. "AFC" (for Automated Frequency Coordination, governed by the United States Code of Federal Regulations, Title 47/Chapter I/Subchapter A/Part 15/Subpart E/§ 15.407(k)) requires that the device remains, depending on its location, below a maximum transmission power.

The power that a power amplifier of the device will have to deliver may thus be much lower than that it is actually capable of delivering. Constantly powering a power amplifier so as to be able to supply the power corresponding to the highest threshold thus to generates overconsumption if only a lower power will actually be used for the transmission of the signal. In the present description, the effective power value or the average power will be considered when "power" is spoken of.

According to one or more exemplary embodiments, it is proposed to dynamically adapt the consumption of a power amplifier intended to amplify a signal to be transmitted to the power that this amplifier must effectively deliver for this signal, in other words the power that it is necessary to transmit. This adaptation is carried out by adjusting the bias voltage of the power amplifier as a function of a parameter or, for certain embodiments, several parameters, so as to reduce the power reserve—which is useless and unused—of the amplifier for a given signal.

According to one or more embodiments, the parameter(s) comprise the frequency channel on which the signal is to be transmitted, as well as optionally the modulation of the signal. The parameters characterize the signal or its transmission. The device has access to data enabling it to calculate the relationship between the parameter(s) and the voltage to be applied. The terms "power supply" or "bias voltage" of the power amplifier will subsequently be used hereinafter without any distinction.

FIG. 1 is an algorithm flowchart showing a first method according to one or more exemplary embodiments. According to the method shown, a communication device initially obtains (E101) the transmission channel of a signal to be transmitted. Based on the transmission channel, the amplifier supply voltage is adjusted (E102). The signal to be transmitted is then amplified (E103). An antenna of the device or connected to the device transmits the amplified signal.

Figure 2:
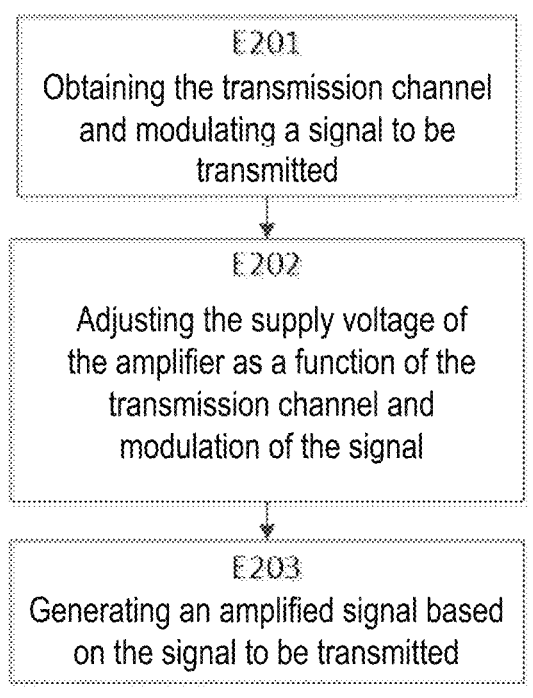
FIG. 2 is an algorithmic flowchart of the method according to a second non-limiting embodiment.

FIG. 2 is an algorithm flowchart showing a second method according to one or more exemplary embodiments. According to the method shown, a communication device initially obtains (E201) the transmission channel of a signal to be transmitted, as well as its modulation. Based on the transmission channel of the modulation, the amplifier supply voltage is adjusted (E202). The signal to be transmitted is then amplified (E203). An antenna of the device or connected to the device transmits the amplified signal.

In what follows, the frequency band(s) in which a device can transmit and/or receive and the frequency channels included in each frequency band will be distinguished. In this respect, the 802.11 standards relate to several frequency bands: 900 MHz, 2.4 GHz, 3.6 GHz, 4.9 GHz, 5 GHz, 5.9 GHz, 6 GHz and 60 GHz, and each band is divided into a multitude of frequency channels. Knowing a channel, the corresponding frequency band is determined.

Two examples of use cases will be described below by way of non-limiting illustration.

(a) In Europe, a power limitation EIRP (Equivalent Isotropic Radiated Power) is set at 23 dBm for the frequency band between 5.15 and 5.35 GHz and 30 dBm for the frequency band between 5.5 and 5.72 GHz.

A transmitter/receiver device of the "Wi-Fi" type has, for example, two power supplies, respectively 5 V and 3 V, for the front-end module(s) it comprises. A digital switch makes it possible to power a front-end module—and its power amplifier—with one or the other of these voltages.

The device transmits on the channel 100, the central frequency of which is at 5500 MHz and the front-end module of which is powered at 5 V. The device then changes to channel, for example following the detection of interference on the channel previously used. The channel 36 is chosen. The central frequency of this channel is 5180 MHz. The limitation therefore goes from 30 dBm EIRP to 23 dBm EIRP.

If certain conditions are met, the method according to certain embodiments implemented by the device can then decide to switch the power supply to 3 V.

(b) In the United States of America, the limitation of maximum authorized power at the output of an antenna connector is 30 dBm for the frequency band between and 5.25 GHz and for the frequency band between 5.725 and 5.825 GHz, but is limited to 24 dBm for the frequency band between 5.25 GHz and 5.35 GHz and for the frequency band between 5.47 and 5.725 GHz.

A transmitter/receiver device of the "Wi-Fi" type has a power supply whose feedback is adjusted with a divider bridge. The device transmits on the channel 36 (5180 MHz) a frame with BPSK modulation with a power of 1 W (+30 dBm). For this power, it was for example determined that the front-end module can be powered at 4 V.

The next frame is modulated in 1024 QAM, which is a so-called "strong" modulation with respect to QPSK or 16 QAM modulations, called "weak", with reference to the number of points in the constellations—the higher the number of points, the "stronger" the modulation will be considered to be. According to one categorization example, a QAM modulation will be considered strong from the 64 QAM included. To hold the 1 W at this modulation without degrading the signal, the method implemented by the device adjusts the value of the power supply of the front-end module to 5 V before sending the frame.

It is then decided to switch to the channel 116 (5580 MHz). The maximum authorized power falls largely within this frequency range. The method according to certain embodiments implemented by the device adjusts the supply voltage to 3 V for low modulations. This voltage is increased for the strongest modulations, according to previously defined data.

According to certain embodiments, if a frequency channel overlaps two bands imposing different limitations, for example in terms of EIRP, the strictest limitation, namely the lowest maximum power threshold, is chosen. Such a case may be for example in the United States of America for a channel of 160 MHz (80+80 MHz) which can be positioned in two frequency bands at once.

The bias voltage applied to the power amplifier is adjusted so that the amplifier can supply the determined power for the signal to be transmitted but that the power reserve beyond this determined power is reduced relative to the power that the amplifier can supply to a nominal bias voltage. A nominal bias voltage is understood to mean the maximum bias voltage applied to the amplifier. This nominal bias voltage may remain necessary to obtain the power required for the transmission of certain signals, but for other signals, it can be lowered. The adjustment of the bias voltage is therefore, where appropriate, such that the power that can be supplied by the amplifier is reduced relative to the nominal power, but always greater than or equal to the maximum power threshold at which the signal is to be transmitted. The average consumption of the amplifier is reduced by this adaptation of the bias voltage.

The data making it possible to compute the relationship between the characteristic(s) of the signal and the voltage to be applied may differ according to the embodiments. According to certain embodiments, they will have been determined beforehand to fall below the maximum usable powers. The data take into account the characteristics specific to the hardware platform of the device. The maximum usable powers are for example obtained from one or more constraints of a regulatory nature and/or derived from one or more industry standards or specification documents. According to certain embodiments, the maximum usable powers vary by geographical area (for example, by region, country, set of countries, etc.).

According to certain embodiments, these data make it possible to determine, depending on the parameter(s) mentioned above, a value of the voltage to be applied, or this data identifies an operating parameter of a variable voltage source which, when applied to the voltage source, has the effect of generating the voltage at the desired value.

According to other embodiments, these data make it possible, depending on the parameter(s), to obtain the maximum usable power value, this value serving as an argument in a function characterizing the hardware platform of the device for obtaining the value of the bias voltage to be applied to the power amplifier.

According to certain embodiments, the type of modulation of the signal is taken into account to determine the voltage to be applied. According to other embodiments, the voltage to be applied is the same regardless of the modulation and takes into account the largest peak factor among the peak factors of the usable modulations. According to other embodiments, the modulation of the signal is not taken into account to determine the voltage to be applied.

An adjustment of the supply voltage of the amplifier may for example be carried out during a change of the communication channel, when starting the device or its front-end module, and/or dynamically for each burst. In the latter case, a variable voltage source that stabilizes sufficiently rapidly is preferably used.

Figure 3:
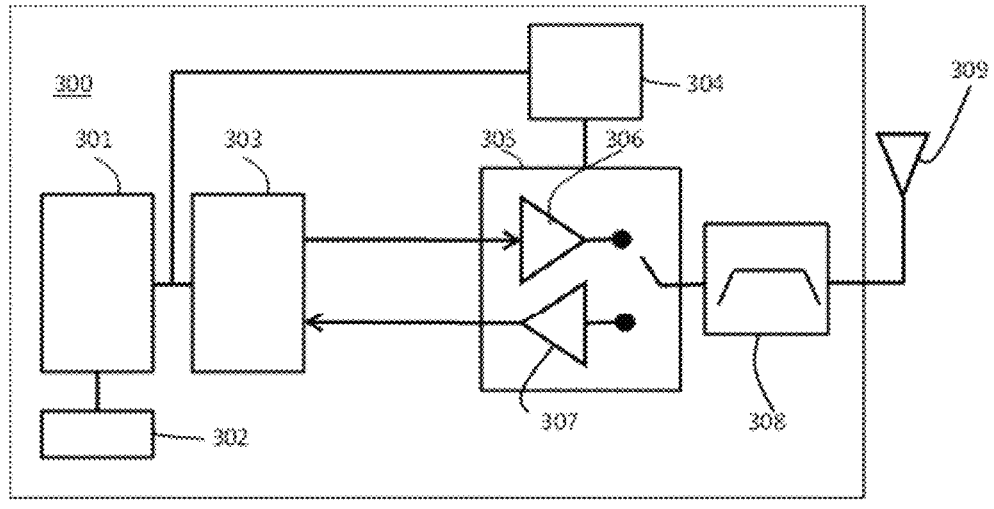
FIG. 3 is a block diagram of a device according to one or more non-limiting embodiments.

FIG. 3 is a functional block diagram of a communication device 300 according to one or more embodiments. The device of FIG. 3 comprises a processor 301 connected to a memory 302. The memory 302 comprises software code that can be executed by the processor 101 to cause the device to implement the various methods described. The device 100 further comprises one or more reception/transmission chains, only one of which is shown in FIG. 3. The transmission chain comprises a processor of digital signals and a modulator/demodulator 303 controlled by the processor 301; as well as a front-end module 305, the latter comprising a power amplifier 306 intended to amplify a signal to be transmitted that is received from the modulator of the block 303, as well as a low-noise amplifier 307 intended to amplify a received signal and transmit it to the demodulator of the block 303. The output of the power amplifier 306 and the input of the low-noise amplifier 307 can selectively be connected to a terminal of a band-pass filter 308, the other terminal of which is intended to be connected to an antenna 309. Depending on the implementation, the antenna 309 can be external to the device 300 or be an integral part of this device.

The device 300 also comprises a variable voltage source 304, the output of which powers the power amplifier 306. According to the present embodiment, the voltage source is controlled by the processor 301, which determines the voltage supplied by the source 304. The memory 302 comprises data used by the processor 301 to determine the value of the voltage as a function of one or more parameters that will be described in more detail below. The variable voltage source can be implemented in various ways. For example, a voltage can be selected via a switch between several different constant to voltage sources. It is also possible to provide a voltage source controlled by the processor, in particular if a finer adjustment of the supply voltage is desired. In the case of a variable voltage source proposing discrete voltage values, the discrete voltage value equal to the voltage to be applied is chosen, or if this is not possible, the next higher discrete value is chosen. In the case of an implementation with continuous or very finely adjustable voltage values, the applied voltage will be substantially equal or very slightly greater than the power determined for the signal to be transmitted. Examples of implementation of the variable voltage source will be seen later in conjunction with FIGS. 6 to 8.

The amplification of a signal is preferably carried out once the supply voltage of the amplifier is sufficiently stable.

The device 300 is for example a transceiver in a network of the "WiFi" type. In this case, the signal to be transmitted is also designated by the term "burst". A burst is understood to mean the transmission of one or more frames, comprising for example respectively a preamble and useful data, intended for one or more receiver devices.

A method for obtaining data making it possible to determine the value of the voltage to be applied to the amplifier according to one or more embodiments will now be described. In the context of this particular example, the data will take the form of a lookup table. It should be noted that although it is called a "table" for simplicity of explanation, it is not necessary for the described data to actually be in the structural form of a table—it is sufficient that the data, regardless of the format, allow the device to determine a voltage to be applied as a function of the channel and optionally as a function of one or more to additional parameters. In particular, the data may be present in the form of a local database, or even remote. The data of these databases can also be updated according to an external query as in the case of an AFC query. As indicated previously, the data make it possible, as a function of the channel to be used for the transmission of a signal, to obtain the value of the voltage to be applied to the amplifier. Or, they make it possible to determine the maximum usable power at the transmission and the voltage to be applied to the amplifier will be determined by a function that gives this voltage as a function of the power. This function is for example an affine or polynomial function determined empirically based on measurements carried out on the hardware platform used, a function of which the coefficients are stored by the gateway and/or the radios.

According to the present example, the maximum authorized power threshold(s) as a function of the operating frequency band(s) of the device are first determined.

According to certain embodiments, it is optionally determined whether a maximum power threshold that is a function of a frequency band is subjected to one or more additional constraints that can, depending on the case, impose an additional drop in the maximum power threshold as a function of the channel. For example and in a non-limiting manner, an additional constraint can be related to compliance with a quality criterion. The additional constraint can impose an additional limitation of the authorized maximum power threshold, but this is not always the case. In the case where an additional constraint exists, the lowest power is chosen between the maximum authorized power as a function of the frequency band and the maximum power imposed by the additional constraint to serve as a reference for the choice of the voltage to be applied to the power amplifier.

It should be noted that implementing a maximum power threshold function of the channel, without taking into account additional constraints, already makes it possible to adjust the amplifier supply voltage and thus to reduce the consumption. The implementation of one or more additional constraints makes it possible, if necessary, to refine the maximum power thresholds as a function of the channel and, if this makes it possible to use lower supply voltages for one or more channels, to further reduce consumption.

An additional constraint may for example depend on the type of modulation applied to the signal. Based on such an additional constraint, it is possible to either:

1. differentiate the maximum power threshold as a function of one or more particular modulations and therefore potentially have a different threshold for each modulation (or for each group of several modulations), or 2. determine a single maximum power threshold corresponding to a modulation considered to be imposing the lowest threshold.

Either of these two approaches can be used, or a mixture of the two approaches. For example, an approach can be used for a first frequency band and the other approach can be used for a second frequency band.

The behavior of the hardware platform is taken into account in order to determine the voltage to be applied in order to comply with the maximum authorized power threshold.

In what follows, the impact of two distinct additional constraints on the to maximum power threshold determined as a function of the frequency band will be described. In the context of the present example, we consider a constraint relating to the modulus of the vector error and a constraint as a function of a power mask as a function of frequency. For the sake of clarity of the description, the analysis of the first constraint will be presented only for strong modulations and the analysis of the second constraint will be presented only for weak modulations. This choice is due to the fact that for strong modulations, the first constraint will impose a stricter limitation than the second constraint, and for weak modulations, it is the second constraint that will impose a stricter limitation.

Figure 4:
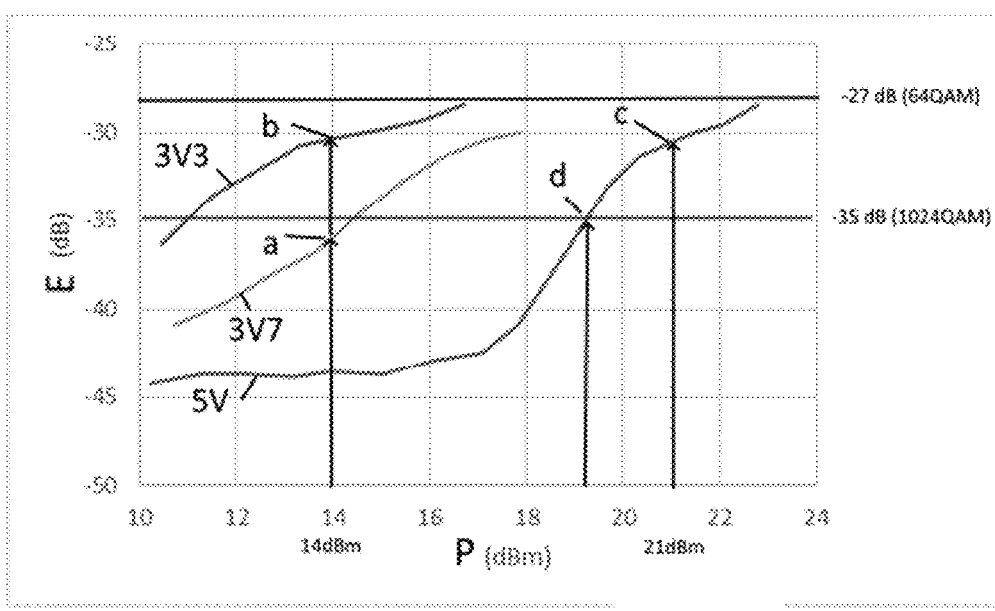
FIG. 4 is a graph representing a modulus of the vector error as a function of the transmission power for different bias voltage values.

The impact of a constraint relating to the module of the vector error will now be described. FIG. 4 is a graph representing an error function E in dB as a function of the transmitted power in dBm for different discrete voltages powering a power amplifier of a front-end module of a transmitter/receiver of a wireless network of the "WiFi" type. The error function is in the present case the Error Vector Magnitude (EVM) module, a quantity that provides a measurement of the error between the ideal points of a modulation constellation and the points actually measured. The curves for three bias voltages are represented, respectively 3.3 V, 3.7 V and 5 V. In the example of FIG. 4, a frame of the IEEE 802.11ax HE 80 MHz MCS11 type at a frequency of 5.5 GHz was used. This frame is chosen since it imposes stronger constraints than other types of frames. If a threshold EVM is met for a frame of the HE-MCS11 type, then this threshold will also be met for these other types of frames. Of course, other frames can be used, depending on the needs of the planned applications.

The curves as a function of the bias voltages of FIG. 4 can be obtained during the characterization of a transmission module before it is put into industrial-scale to production, in one example. In another example, these EVM measurements are carried out during a factory test phase during the assembly of the communication device comprising the transmission module ("front-end module" or "FEM"). Again in another example, the communication device comprising the transmission module performs a self-calibration phase making it possible to perform these measurements.

As an example, for this standard, the limits EVM defined by the IEEE are respectively −35 dB and −27 dB for respectively the transmission of a 1024 QAM modulation signal and a 64 QAM modulation signal—these two limits are schematically indicated by two horizontal lines in FIG. 4.

(a) The limitation in Europe for transmissions on the frequency band between 5.15 and 5.35 GHz is 23 dBm EIRP. As an example, with a combined gain (or average gain between the antennas) of 3 dBi and for a system of four antennas, the maximum power on each antenna will thus be:

$$P=\text{EIRP}-\text{Gain}-10\ \log(N_{ant})\cong23-3-6\cong14\ \text{dBm} \qquad \text{[Math. 1]}$$

The value of 14 dBm is shown on the graph by a vertical arrow. Below the limit EVM of −35 dB, two voltage curves exhibit an intersection with the vertical at 14 dBm: the curve of 3.7 V (designated by 3V7 on the graph of FIG. 4) and the curve of 5 V. For 1024 QAM modulation, to emit at the maximum possible power while complying with the imposed constraints, a voltage of 3.7 V will be chosen, the intersection with the vertical at 14 dBm is situated at the point "a", closer to the limit of the error criterion than for example the intersection of the curve of the voltage at 5 V with the vertical at 14 dBm. The point "b" at the intersection between the vertical to 14 dBm and the curve 3.3 V (denoted by "3V3" on the graph of FIG. 4) does not meet the constraint of the limit EVM of −35 dB for a modulation "high" 1024 QAM. For a 64 QAM modulation, the voltage at 3.3 V can be lowered, this intersection "b" between the vertical to 14 dBm and the curve 3.3 V being the intersection located below and closest to the EVM limit of −27 db. According to a particular embodiment, the transmission is carried out below the maximum power per antenna, even if it is possible to transmit to this power while complying with the various legislation and/or technical constraints imposed.

(b) For the frequency band between 5.5 and 5.72 GHz, a limit of 30 dBm EIRP is allowed in Europe. In the context of the example already given above (3 dBi combined gain and four antennas) and by applying the same calculation, there is a maximum power of 21 dBm per antenna. This value is also shown by a vertical arrow in the graph. A single curve has a point at this power (point "c"). However, this point is situated above the limit EVM of −35 dB. It will therefore not be possible to emit at the authorized maximum power of 21 dBm, at least with the discrete voltage values available in the present example. The voltage of 5 V will then be chosen, but by imposing it at a power lower than or equal to that corresponding to the point of intersection "d", between the curve corresponding to the voltage of 5 V and the upper limit EVM of −35 dB, for example to a power close to 19 dBm. All the constraints imposed are thus respected. It should be noted that the voltages of 3.3 V and 3.7 V do not make it possible to emit at a power close to the imposed maximum power. It is therefore not considered for this frequency band.

Figure 5:
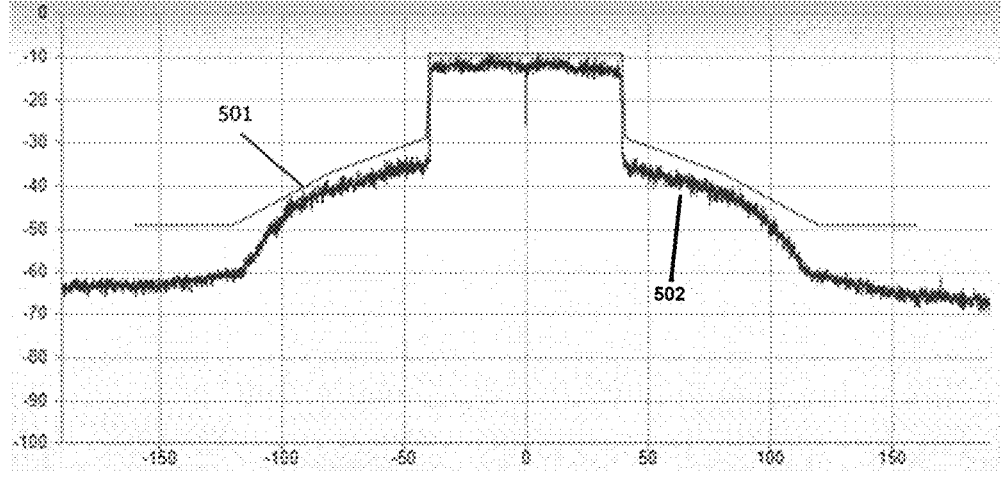
FIG. 5 is a graph showing a spectral power density relative to a template for a given supply voltage.

The impact of a constraint relating to the spectral mask will now be described. According to the present example, for so-called "low" modulations, that is, as indicated to above, modulations with constellations with few points, which includes modulations ranging from BPSK to 16 QAM, the spectral mask (or template) may impose a limiting constraint in terms of power. To do this, the maximum power that can be used while remaining within the scope of an imposed template is determined. In the context of a "WiFi" network, this template is imposed by the IEEE. FIG. 5 is a screen capture of a measurement carried out for an IEEE 802.11ax frame as mentioned above, for a frequency band around a central frequency of 5.53 GHz and a voltage of 3.7 V. The imposed template is referenced 501, while the graph of the power as a function of the frequency around the central frequency is referenced 502. The x-axis represents the frequency in MHz around the central frequency, while the y-axis represents the spectral power density in dBm/RBW at 100 kHz. For this scenario, it was determined that the maximum usable power that makes it possible to remain within the template is 19.35 dBm. A similar measurement was carried out for the voltages of 3.3 V and 5 V respectively. Table 1 summarizes the results. It appears that even at 3.3 V, the spectrum will be well contained in the template for a power of 14 dBm. The template therefore does not require lowering the power further than the maximum imposed threshold mentioned previously.

TABLE 1

| Voltage applied | Maximum power for which the spectrum is contained within the template |
| --- | --- |
| 5 V | 22.16 dBm |
| 3.7 V | 19.35 dBm |
| 3.3 V | 16.69 dBm |

Table 2 comprises the data that a communication device uses to determine, from the channel to be used for the transmission of a frame and of the modulation applied, the bias voltage to be applied to the power amplifier. The first line of Table 2 repeats point (c) mentioned above for the band 5.15 to 5.35 GHz. For this same band, the second line combines the results at point (a) for the two modulations 64 QAM and 1024 QAM by choosing to apply the same voltage of 3.7 V—it would have been possible to distinguish these two modulations and to apply a voltage of 3.3 V for the 64 QAM. For the sake of simple implementation, it is chosen to have only one voltage. The third line of the table assumes the most unfavorable case as discussed in (b)—indeed, the 1024 QAM modulation requires a voltage of 5 V. The person skilled in the art will know how to adapt the necessary level of detail of the data.

It should be noted that Table 2 is given by way of illustration. The data stored in the device 300 or accessible by same remotely may be different. For example, the applied voltage may simply be identified by a source index to which the processor will switch the output of the variable voltage source ("Source 1", "Source 2", "Source 3") in the case of discrete voltages, or by reference to a known maximum value, in the form of a ratio (e.g. 50% of the maximum voltage), which will be used to control a variable voltage generator. In such a case, including an explicit expression of the power targeted for each antenna is not necessarily required because it will not be used by the device. As indicated above, it is also possible to provide a targeted power value to derive therefrom, for example by virtue of a linear or polynomial function, a voltage value to be generated, which value will be used by the processor to control a variable voltage generator. The person skilled in the art will know how to adapt the data to the envisaged application and to the specificities of the hardware platform.

TABLE 2

| Frequency band | Modulation | Power targeted for each antenna | Voltage applied |
|---|---|---|---|
| 5.15-5.35 GHz | Low (BPSK-16 QAM) | 14 dBm | 3.3 V |
| 5.15-5.35 GHz | Strong (64 QAM-1024 QAM) | 14 dBm | 3.7 V |
| 5.5-5.72 GHz | All modulations | 19 dBm | 5 V |

Table 3 gives an example of energy savings that can be carried out according to a specific example on real equipment provided by way of illustration. The table shows that for example a reduction in the supply voltage of the module front from 5 V to 3.7 V, a saving of about 1.4 W can be obtained, that is a drop of 34%.

TABLE 3

| Voltage applied | Current | Power consumed by 1 FEM transmitting 14 dBm | Power consumed for a total of 4 antennas transmitting at 14 dBm |
|---|---|---|---|
| 5 V | 208 mA | 1.04 W | 4.16 W |
| 3.7 V | 190 mA | 0.70 W | 2.73 W |
| 3.3 V | 184 mA | 0.61 W | 2.43 W |

Different embodiments of variable voltage sources will now be described.

Figure 6:
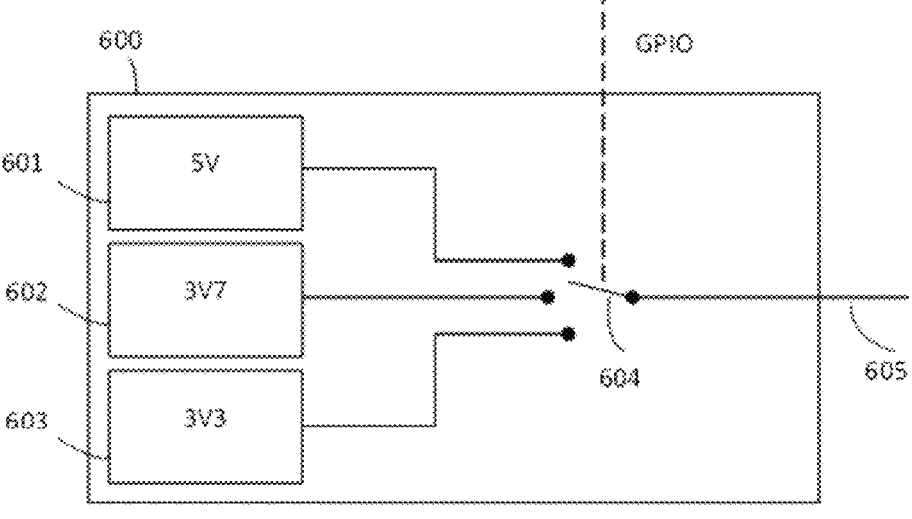
FIG. 6 is a first non-limiting embodiment of a variable voltage source of the device according to FIG. 1.

FIG. 6 is a block diagram of a first embodiment of a variable voltage source. In the case of FIG. 6, the variable voltage source 600 comprises as many constant voltage sources as it is necessary to have discrete voltage values, for example three sources 601 to 603. A switch 604 switches one of the constant voltage sources to the output 605 of the variable voltage source, under the control of the processor 301 via a GPIO signal.

Figure 7:
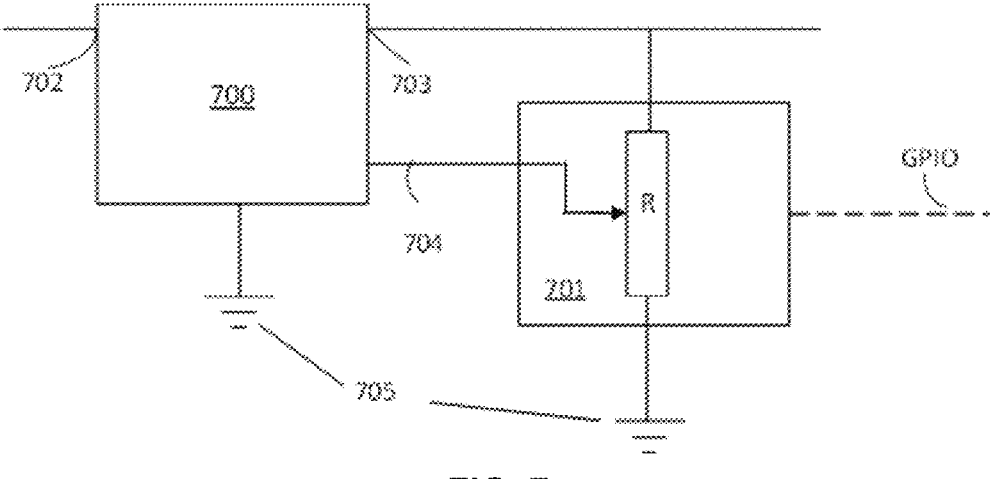
FIG. 7 is a second non-limiting embodiment of a variable voltage source of the device according to FIG. 1.
Figure 8:
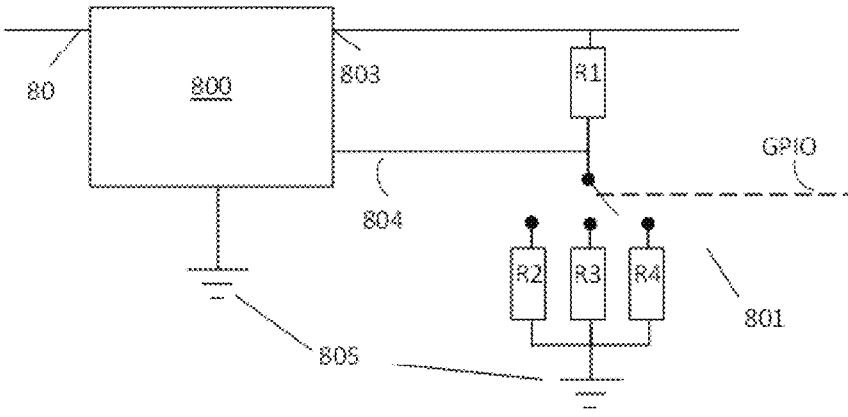
FIG. 8 is a third non-limiting embodiment of a variable voltage source of the device according to FIG. 1.

FIG. 7 is a block diagram of a second embodiment of a variable voltage source. In the case of FIG. 7, the variable voltage source comprises a variable power supply 700 and a potentiometer 701, the output of which is connected by a line 704 to a return loop input of the variable power supply 700. The variable power supply has an input 702 and an output 703, which provides the desired supply voltage. The output 703 of the supply 700 is also connected to a terminal of the potentiometer 701, while the other terminal is connected to the ground 705. The potentiometer 701 is controlled by the processor 301 via a GPIO signal—the potentiometer acts as a variable divider bridge and provides on the line 704 a voltage located between the output voltage 703 and the ground and a function of the GPIO signal. The output voltage 703 depends on the input voltage in 702 and on respective resistances of the divider bridge. The control of the variable power supply 700 can therefore be adjusted by acting on the digital potentiometer 701. FIG. 8 is a block diagram of a third embodiment of a variable voltage source.

In the case of FIG. 8, the variable voltage source comprises a variable power supply 800 and a divider bridge 801, the output of which is connected by a line 804 to a return loop input of the variable power supply 800. The variable power supply has an input 802 and an output 803, which provides the desired supply voltage. The output 803 is also connected to a terminal of the dividing bridge 801, while the other terminal is connected to the ground 805. The divider bridge 801 comprises a resistor R1 connected to a switch that can switch to three respective resistors R2, R3, R4. The switch is controlled by the processor 301 via a GPIO signal—the variable divider bridge thus formed provides on the line 804 a voltage depending on the input voltage, on the resistor R1 and on one of the resistors R2 to R4. The resistance values are chosen appropriately so that the voltage source can generate three desired voltage values. The control of the variable power supply 800 can be adjusted by acting on the digital potentiometer 801 by switching to one of the resistors R2 to R4.

In the foregoing, various advantages have been described. A specific embodiment may have only one or more of said advantages, but not necessarily all the advantages. Certain embodiments may have one or more advantages that are not described and do not have any of the advantages described.

REFERENCE SIGNS

300—Communication device
301—Processor
302—Memory
303—Signal processor and RF modulator
304—Variable voltage source
305—Front-end module
306—Power amplifier
307—Low-noise amplifier
308—Bandpass filter
309—Antenna
600—Variable voltage source
601—First constant voltage source
602—Second constant voltage source
603—Third constant voltage source
604—Switch
605—Variable voltage source output
700—Variable power supply 701—Digital potentiometer
702—Input of variable power supply
703—Output of variable power supply
704—Return loop line
705—Ground
800—Variable power supply
801—Digital potentiometer
802—Input of variable power supply
803—Output of variable power supply
804—Return loop line
805—Ground

The invention claimed is:

1. A communication device comprising:

a power amplifier configured to amplify a signal intended to be emitted on a frequency channel;

a variable voltage source for providing a bias voltage of the amplifier; and a memory comprising software code and a processor which, when executing the software code, causes the device to adjust the bias voltage provided by the variable voltage source according to at least one parameter comprising the frequency channel, the processor and the software code being adapted to lead the device to produce, from pre-programmed data and as a function of the at least one parameter, a control signal of the variable voltage source, said control signal being representative of the adjusted value of the bias voltage, the adjusted bias voltage being adapted to, when a power that the amplifier can supply at a nominal bias voltage is not necessary for the transmission of the signal, decrease the power that the amplifier can supply following the adjustment of the bias voltage, the power that the amplifier can supply following the adjustment being greater than or equal to a maximum transmission power threshold of the signal as a function of the at least one parameter and wherein the decrease is adapted to reduce a power reserve of the amplifier above the threshold, and the at least one parameter comprising a modulation of the signal, the pre-programmed data being such that for a given frequency channel, a bias voltage produced for a first modulation defined by a constellation comprising a first number of points is greater than a bias voltage produced for a second modulation comprising a second number of points, the second number of points being greater than the first number of points.

2. The device according to claim 1, the data being configured to allow the device to obtain, as a function of the at least one parameter, at least one of:

a value of the control signal;

a bias voltage value to be used for the signal; or a maximum transmission power value to be used for the signal.

3. The device according to claim 2, wherein the at least one value is adapted to limit the power supplied by the amplifier to respect at least one of:

a maximum power constraint based on a frequency band to which frequency channel belongs; or if the frequency channel overlaps with several frequency bands, a strict constraint among constraints respectively depending on each of the frequency bands.

4. The device according to claim 1, the processor and the software code being adapted to, in the case where the voltage source generates discrete values of bias voltage, cause the device to produce a control signal value of the variable voltage source corresponding to an equal discrete voltage value or a discrete voltage value immediately above a voltage value determined from the data.

5. A method implemented by a communication device comprising a power amplifier configured to amplify a signal intended to be emitted on a frequency channel; a variable voltage source for supplying a bias voltage of the amplifier; a memory comprising software code and a processor which, when it executes the software code, causes the device to perform the method, the method comprising:

adjusting the bias voltage provided by the variable voltage source as a function of at least one parameter comprising the frequency channel; and generating, as a function of pre-programmed data and the at least one parameter, a control signal of the variable voltage source, said control signal being representative of the adjusted value of the bias voltage, the adjusted bias voltage is adapted to, when a power that the amplifier can supply at a nominal bias voltage is not necessary for the transmission of the signal, decrease the power that the amplifier can supply following the adjustment of the bias voltage, the power that the amplifier can supply following the adjustment being greater than or equal to a maximum transmission power threshold of the signal as a function of the at least one parameter and wherein the decrease is adapted to reduce a power reserve of the amplifier above the threshold, the at least one parameter comprising a modulation of the signal, and the pre-programmed data being such that for a given frequency channel, a bias voltage produced for a first modulation defined by a constellation comprising a first number of points is greater than a bias voltage produced for a second modulation comprising a second number of points, the second number of points being greater than the first number of points.

6. The method according to claim 5, the data being configured to allow the device to obtain, as a function of the at least one parameter, at least one of:

a value of the control signal;

a bias voltage value to be used for the signal; or a maximum transmission power value to be used for the signal.

7. The method according to claim 6, wherein the at least one value is adapted to limit the power supplied by the amplifier to respect at least one of:

a maximum power constraint based on a frequency band to which frequency channel belongs; or if the frequency channel overlaps with several frequency bands, a strict constraint among constraints respectively depending on each of the frequency bands.

8. The method according to claim 5, comprising in the case where the voltage source generates discrete values of bias voltage, producing a control signal value of the variable voltage source corresponding to an equal discrete voltage value or a discrete voltage value immediately above a voltage value determined from the data.

9. A non-transitory storage medium readable by a device provided with a processor, said medium comprising instructions which, when the program is executed by a processor of a device, bring the device to implement the method of claim 5.

* * * * *